United States Patent [19]
Okamoto

[11] Patent Number: 6,103,146
[45] Date of Patent: Aug. 15, 2000

[54] THICK FILM CONDUCTOR PASTE COMPOSITIONS FOR ALUMINUM NITRIDE SUBSTRATES

[75] Inventor: Kuninori Okamoto, Yokohama, Japan

[73] Assignee: E. I. du Pont de Nemours and Company, Wilmington, Del.

[21] Appl. No.: 08/970,265

[22] Filed: Nov. 14, 1997

Related U.S. Application Data

[63] Continuation of application No. 08/671,907, Jun. 28, 1996, abandoned.

[30] Foreign Application Priority Data

Aug. 16, 1995 [JP] Japan ................................. 7-229635

[51] Int. Cl.[7] .............................. H01B 1/02; H01B 1/16; H01B 1/22
[52] U.S. Cl. ........................ 252/514; 252/521.4; 106/1.15
[58] Field of Search .................. 106/1.18, 1.21, 106/1.25, 1.15; 252/512, 514, 521.4

[56] References Cited

U.S. PATENT DOCUMENTS

| | | | |
|---|---|---|---|
| 3,929,674 | 12/1975 | Patterson | 252/514 |
| 4,420,338 | 12/1983 | Ortega | 106/20 |
| 4,696,764 | 9/1987 | Yamazaki | 252/503 |
| 4,906,404 | 3/1990 | Suehiro et al. | 252/512 |
| 4,961,987 | 10/1990 | Okuno et al. | 428/209 |
| 5,164,246 | 11/1992 | Tanaka et al. | 428/209 |
| 5,204,166 | 4/1993 | Ito et al. | 428/209 |

FOREIGN PATENT DOCUMENTS

| | | |
|---|---|---|
| 0 153 737 | 2/1985 | European Pat. Off. . |
| 0 587 382 | 9/1993 | European Pat. Off. . |

OTHER PUBLICATIONS

Patent Abstracts of Japan, vol. 014, No. 562 (C–0788), Dec. 13, 1990, & JP 02 243581 A, (Fujitsu Ltd.), Sep. 27, 1990.
Chemical Abstracts, vol. 111, No. 12, Sep. 18, 1989, Abstract No. 107109, XP002020707 & JP 01 076 605.
Chemical Abstracts, vol. 111, No. 12, Sep. 18, 1989, Abstract No. 107110, XP002020708 & JP 01 077803 (Fujitsu Ltd.) Mar. 23, 1989.
Patent Abstracts of Japan, vol. 013, No. 117 (E–731), Mar. 22, 1989 & JP 63 289702 (Fujitsu Ltd.), Nov. 28, 1988.
Patent Abstracts of Japan, vol. 014, No. 178 (E–0915), Apr. 10, 1990, & JP 02 031496 (Fujitsu Ltd.), Feb. 1, 1990.
Database WPI, Section Ch, Week 9231, Derwent Publications Ltd., Class L03, AN 92–254424, XP002020709 & 04 171 604 (Hitachi Ltd.) Jun. 18, 1992.

*Primary Examiner*—Mark Kopec

[57] ABSTRACT

The invention relates to thick film conductor paste compositions with which thick film technology can be applied to aluminum nitride substrates and which can form a conductor as a thick film on a substrate by printing or coating and then firing and paste compositions as dispersions, which are obtained by dispersing a conductive powder and a boride in an organic medium.

2 Claims, 1 Drawing Sheet

THICK FILM CONDUCTOR PASTE COMPOSITIONS FOR ALUMINUM NITRIDE SUBSTRATES

This is a continuation of application Ser. No. 08/671,907 filed Jun. 28, 1996, now abandoned.

FIELD OF INVENTION

The present invention relates to thick film conductor paste compositions, and in particular to thick film conductor paste compositions that can be printed as a film on aluminum nitride substrates by the usual method.

BACKGROUND OF INVENTION

Generally, thick film conductor paste compositions contain a conductive component, a binder, and an organic vehicle as the principal components. As the conductive component, fine powders of the noble metals palladium (Pd), platinum (Pt), and silver (Ag), or mixtures or alloys thereof, or oxides of palladium and silver, or mixtures thereof, have been widely used. Glass binder is used for the binder, and an inert liquid is used as the organic medium.

These thick film conductor pastes are applied to the substrate by screen printing and fired in the printing pattern. For the substrate, a ceramic substrate made from alumina or aluminum nitride is often used.

In recent years it has been desired to employ aluminum nitride substrates for circuit boards used under high-temperature environments because of their high heat conduction coefficient. However, in order to adhere metal conductors to aluminum nitride substrates, it was necessary to use thick film technology, which adheres the conductor via a thin reactive layer (oxide film) formed between the metal and substrate by introducing the metal in atomic form to the surface of the ceramic substrate so that the metal, which is extremely active chemically, bonds with the excess oxygen that exists in the surface of the substrate. The required large and expensive equipment of the pulsed laser accumulation method, etc., entailed such problems as poor reactions because of the nitrogen contained or the evolution of nitrogen oxides. Therefore, the development of thick film conductor paste compositions with which thick film technology can be applied to aluminum nitride substrates and using a conductor which can be formed as "thick film" on aluminum nitride substrates by printing or coating the conductor paste and subsequently firing has been desired.

SUMMARY OF THE INVENTION

The object of the invention is to provide thick film conductor paste compositions that can be screen printed on aluminum nitride substrates, which compositions are obtained by dispersing a conductor powder and a boride in an organic medium.

Another object of the invention is to provide thick film conductor paste compositions that can be screen printed on aluminum nitride substrates, which compositions are obtained by dispersing a conductor powder and a boride, which is either a binary compound of boron and a metallic element or a ternary or higher compound that contains boron, in an organic medium.

In addition, it is the object of the invention to provide thick film conductor paste compositions that can be screen printed on aluminum nitride substrates, which compositions are obtained by dispersing a conductor powder and at least one metal boride selected from the group consisting of $TiB_2$, $ZrB_2$, $HfB_2$, $UB_2$, $NbB_2$, $TaB_2$, $CrB_2$, $MoB_2$, $W_2B_5$, $CaB_6$, $SrB_6$, $BaB_6$, $LaB_6$, $CeB_6$, $PrB_6$, $NdB_6$, $SmB_6$, $EuB_6$, $Ni_3B_6$, and $Ni_2B_6$ in an organic medium.

Figure 1:
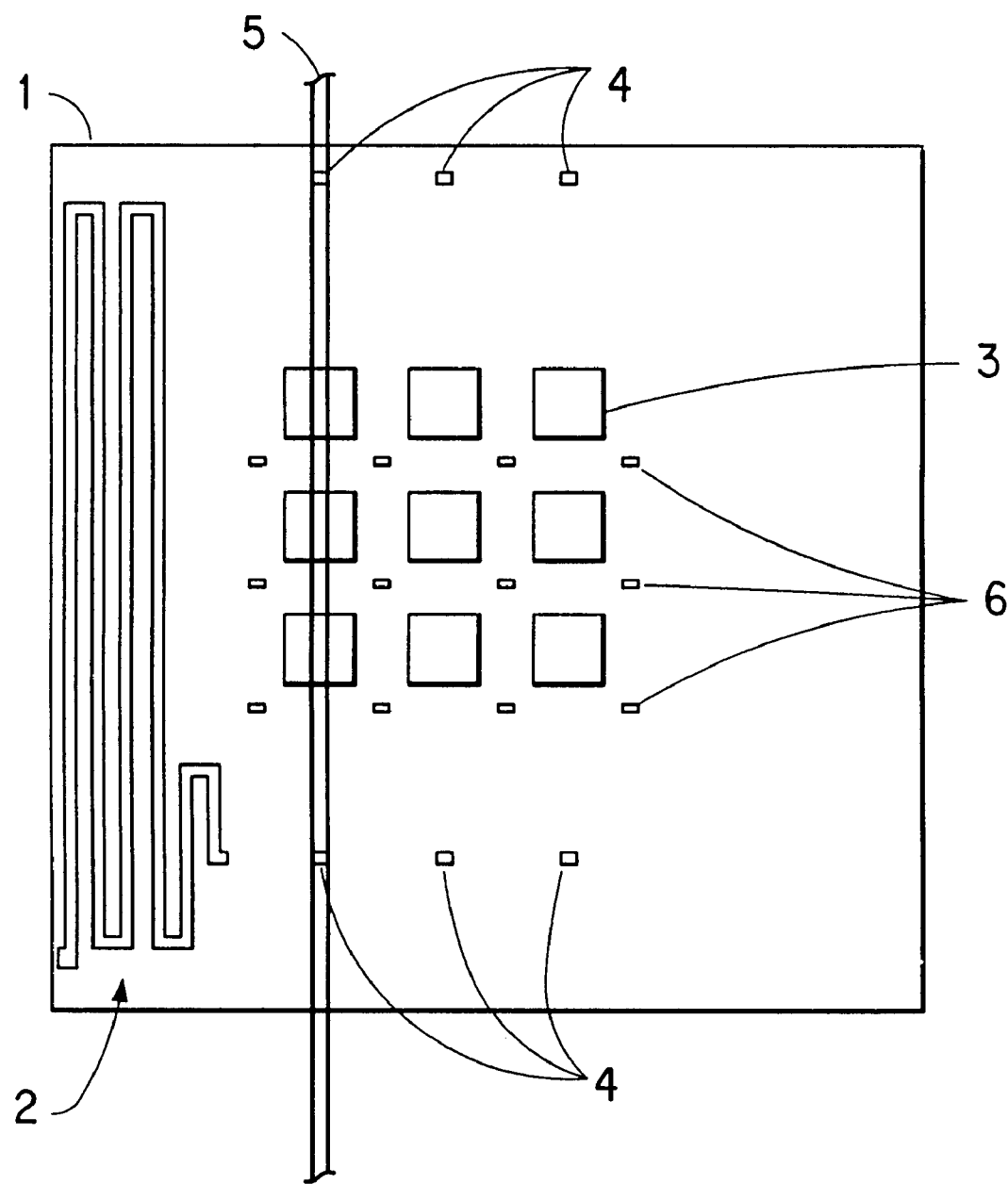
FIG. 1 is a plan view showing the test pattern used when conducting the properties tests of the thick film conductor paste of this invention.

Keys:
1. Test pattern
2. Conductor resistance test pattern
3. Pad
4. Wire register mark
5. Wire
6. Wire bending mark

DETAILED DESCRIPTION OF INVENTION

An object of this invention is to provide thick film conductor paste compositions with which thick film technology can be applied to aluminum nitride substrates and which can form the conductor as a "thick film" on aluminum nitride substrates by printing or coating and then firing.

Another object of this invention is to provide thick film conductor paste compositions with which thick film technology can be applied to aluminum nitride substrates, which can form the conductor as a "thick film" on aluminum nitride substrates by printing or coating and then firing, and which enable soldering or plating while retaining good solder wetting properties on the conductor surface obtained.

The thick film conductor paste of one embodiment of this invention that attains the above objectives is a thick film conductor paste composition that can be screen printed on aluminum nitride substrates, which is obtained by dispersing the conductor powder and a boride in an organic medium.

The borides used in this invention are compounds comprising boron and a metallic element. These compounds include binary compounds of boron and a metallic element (called metal borides) and ternary or higher compounds that include boron. They include all compounds that generate boric acid upon heating in air in the temperature range of 600–1,000° C. As examples of metal borides, $TiB_2$, $ZrB_2$, $HfB_2$, $UB_2$, $NbB_2$, $TaB_2$, $CrB_2$, $MoB_2$, $W_2B_5$, $CaB_6$, $SrB_6$, $BaB_6$, $LaB_6$, $CeB_6$, $PrB_6$, $NdB_6$, $SmB_6$, $EuB_6$, $Ni_3B_6$, and $Ni_2B_6$ can be mentioned.

The boride used in this invention basically can be included to an extent that does not cause poor solder wetting as a result of the $B_2O_3$ formed from boron in the paste-firing process becoming vitrified and covering the conductor surface. This $B_2O_3$ that can cause poor solder wetting is related to the kind of noble metal used as the conductor and to its form, that is, whether pure or alloy, and the density of the thick film after firing can be controlled. Consequently, it is possible to inhibit precipitation of the $B_2O_3$ that is produced because it becomes vitrified (the amount of $B_2O_3$ produced will also vary by the kind of boride) in the thick film surface, so that amount of boride contained can be selected from a fairly wide range.

For example, when $ZrB_2$ is used as the boride in this invention, the amount of $ZrB_2$ contained must be no more than 1.6 parts by weight per 100 parts by weight of silver conductor in order to apply the thick film conductor paste composition of this invention on an aluminum nitride substrate without causing poor solder wetting.

The conductive powder used in this invention can be any noble metal powder. In general, all metals that are called noble metals can be used, but in particular, gold, silver, platinum, palladium,. rhodium, and mixtures or alloys of these can be used. These metals or their alloys are used in the form of fine powders. The particle diameter of the metal powder is not particularly important as long as it appropriates to the application method.

In this invention, the above conductive powder and boride can be dispersed in an organic vehicle to produce a dispersion called a "paste", which usually has semifluid softness.

The ratio of organic vehicle in the thick film paste compositions of this invention to the inorganic solids in the dispersion is dependent on the method of applying the paste and the kind of organic medium used, and it can vary.

Usually, the dispersion will contain 50–90 wt % of inorganic solids and 10–50 wt % of vehicle in order to obtain good coating.

All inert liquids can be used as the vehicle. Water or any one of various organic liquids, to which thickening agents and/or stabilizer and/or other common additives may or may not be added, can be used as the vehicle. Examples of organic liquids that can be used are aliphatic alcohols, esters of those alcohols such as acetates and propionates, terpenes such as turpentine, terpineol, etc., and solutions of resins such as polymethacrylates of lower alcohols and ethylcellulose in solvents such as turpentine and monobutyl ether of ethylene glycol monoacetate. Volatile liquids for promoting rapid hardening after application on the substrate can be included in the vehicle, or the vehicle can be made from these.

The preferred vehicles are based on ethylcellulose and β-terpineol.

In this invention, glass binder can be additionally added to the above-described paste composition. The composition of the glass itself used in the glass binder is not critical. Any that does not react with the conductor phase and the borides discussed earlier, has a coefficient of thermal expansion suited to the aluminum nitride substrate, and has sufficient viscosity and glass flow at firing temperatures to assist sintering of the metal particles that form the conductor phase in the firing process.

Accordingly, a broad range of kinds of glass oxides that have common glass-forming properties and glass-modifying components are, for example, aluminoborosilicate, lead silicates such as lead borosilicate and lead silicate itself, and bismuth silicate.

The particle diameter of the glass binder does not particularly have a critical value. However, the glass particles should be in the range of 0.1 to 10 microns (preferably 0.5–5 microns), and the average particle diameter should be 2–3 microns. Fine glass of less than 0.1 micron has an extremely great surface and requires a large amount of organic medium to obtain appropriate flow as a printing paste. However, if the particles are greater than 10 microns, they will pose an obstacle to screen printing.

The metal oxides and $B_2O_3$ produced by oxidation in the firing process react with the aluminum nitride substrate, producing an oxidation reaction product ($2Al_2O_3 \cdot B_2O_3$), which contributes to adhesion between the metal, or conductor, and the substrate.

A test pattern 1 with a conductor resistance test pattern 2 and pads (2×2 mm) 3 such as shown in FIG. 1 was used, and a thick film paste composition was screen printed on the aluminum substrate, dried, and fired so that the thickness of the conductor after firing was about 10 μm.

1. Measurement of Resistance Value

The resistance value of the conductor resistance test pattern 2 was measured N times (N=4). The average value was divided by 200 to find the resistance value per unit surface area, and then the unit surface resistance value per 10 μm thickness (unit: ohm/square) was found based on measured film thickness.

2. Adhesive Strength

Three clip-like wires 5 were attached in accord with the wire register marks 4 provided on the test pattern 1 to the nine pads (2 mm×2 mm) 3 of FIG. 1 and soldered at a temperature of 220° C.±5° C. in that state. The solder composition used was tin/lead/silver=62/36/2. After soldering, this was allowed to cool at room temperature for 16 hours, following which the wires were bent to 90° in accord with the bending marks 6 at the bottom, and tensile strength was measured N times (N=12). Here N=12 was adopted, and the average of twelve measurements was used as the adhesive strength of the thick film conductor applied to the substrate.

3. Solder Wetting

The test pattern of FIG. 1 was immersed (for 5 s) in solder (the same as used to measure adhesive strength) and then removed, and the state of solder adhesion to the pads 3 was observed.

Measurement was carried out by the ratio of the pads to which solder had adhered completely so that the conductor surface not visible to the total number of pads. In the case of this invention, 90% or above is considered good.

EXAMPLES

This invention will now be described in further detail with practical examples and comparative examples. In these examples, the mixing ratio of conductive powder, metal boride, and vehicle is shown in Table 1 as percent by weight (wt %).

Practical Examples 1–10

Silver powder, zirconium boride, and vehicle were mixed in the weight ratios stated in Table 1 and kneaded thoroughly with a triple-roll milling machine to obtain thick film conductor pastes, which were dispersions. The paste compositions obtained were adjusted to a rheology suitable for screen printing as desired.

The thick film paste compositions adjusted as above were applied to aluminum nitride substrates by screen printing, and the patterns obtained were fired at 850° C. to produce the thick film conductors of this invention, these conductors being 10 μm thick after firing.

The resistance value, adhesive strength, and solder wetting of these conductors were evaluated by the methods indicated above, and the results are shown in Table 1.

Practical Example 11

Silver powder, zirconium boride, and a glass binder of the composition shown in Table 2 were dispersed in the ratios shown in Table 1 in a vehicle comprising ethylene cellulose and β-terpineol and were kneaded with a triple-roll mill to prepare a paste composition. A thick film conductor was produced by the same procedure used in Practical Examples 1–10. Its properties were measured, and the results are shown in Table 1.

Comparative Example

A paste composition was prepared as a comparative example as in Practical Examples 1–11, except for not including a boride, by including silver powder in the weight ratio shown in Table 1, dispersing it in the vehicle, and kneading with a triple-roll mill. The paste composition obtained was applied on an aluminum nitride substrate by the same method indicated in the practical examples. Also, the resistance value, adhesive strength, and solder wetting of the thick film paste formed on the substrate were measured as in Practical Example 1. The results are shown in Table 1.

TABLE 1

|  | Comparative Example | Practical Examples | | | | | | | | | | |
| --- | --- | --- | --- | --- | --- | --- | --- | --- | --- | --- | --- | --- |
|  |  | 1 | 2 | 3 | 4 | 5 | 6 | 7 | 8 | 9 | 10 | 11 |
| Conductive powder Ag (wt %) | 84.2 | 83.3 | 83.1 | 82.4 | 81.3 | 79.5 | 77.7 | 72.1 | 67.2 | 63.0 | 59.3 | 83.2 |
| Boride $ZrB_2$ (wt %) | 0 | 1.0 | 1.3 | 2.2 | 3.5 | S.6 | 7.8 | 14.4 | 20.2 | 25.2 | 29.6 | 0.6 |
| Glass (wt %) | 0 | 0 | 0 | 0 | 0 | 0 | 0 | 0 | 0 | 0 | 0 | 0.6 |
| Vehicle (wt %) |  |  |  |  |  |  |  |  |  |  |  |  |
| β-Terpineol solution of ethylcellulose (where β-terpineol was appropriately added to give a printable viscosity) | 15.8 | 15.7 | 15.6 | 15.4 | 15.2 | 14.9 | 14.6 | 13.5 | 12.6 | 11.8 | 11.1 | 15.6 |
| Firing temperature (° C.) | 850 | 850 | 850 | 850 | 850 | 850 | 850 | 850 | 850 | 850 | 850 | 850 |
| Properties |  |  |  |  |  |  |  |  |  |  |  |  |
| (1) Resistance (mohm/sq. @ 10 μm) | 2.1 | 2.9 | 3.4 | 3.6 | 3.8 | 4.8 | 5.6 | 11.0 | 27.0 | 57.0 | 69.9 | 3.3 |
| (2) Adhesive strength (Newton) | 0 | 20 | 24 | — | — | — | — | — | — | — | — | 20 |
| (3) Solder wetting | Good | Good | Good | Poor | Poor | Poor | Poor | Poor | Poor | Poor | Poor | Good |

According to the thick film conductor paste compositions of this invention, thick film technology can be applied to aluminum nitride substrates and a conductor that adheres firmly to the substrate can be formed as a thick film by printing or coating and then firing. Because good solder wetting properties are obtained, it is possible to solder or solder plate on the conductor surface formed on the substrate.

I claim:

1. A thick film composition which is screen-printable onto an aluminum nitride substrate consisting essentially of (a) a binary metal boride selected from the group consisting of: $TiB_2$, $ZrB_2$, $HfB_2$, $UB_2$, $NbB_2$, $TaB_2$, $CrB_2$, $MoB_2$, $W_2B_5$, $CaB_6$, $SrB_6$, $BaB_6$, $LaB_6$, $CeB_6$, $PrB_6$, $NdB_6$, $SmB_6$, $EuB_6$, $Ni_3B_6$, and $Ni_2B_6$; which is reactive with the aluminum nitride substrate upon firing (b) an air-fireable electrically conductive powder selected from the group consisting of gold, silver, platinum, palladium, rhodium, mixtures and alloys thereof; and, (c) an organic medium with the provisos that (i) the metal boride is no more than 1.6 parts by weight per 100 parts by weight of the conductive powder; and (ii) the total composition is air-fireable.

2. The composition of claim 1 further comprising a glass binder.

* * * * *